(12) United States Patent
Kal et al.

(10) Patent No.: US 9,748,110 B2
(45) Date of Patent: Aug. 29, 2017

(54) METHOD AND SYSTEM FOR SELECTIVE SPACER ETCH FOR MULTI-PATTERNING SCHEMES

(71) Applicant: Tokyo Electron Limited, Minato-ku, Tokyo (JP)

(72) Inventors: Subhadeep Kal, Albany, NY (US); Angelique D. Raley, Mechanicsville, NY (US); Nihar Mohanty, Clifton Park, NY (US); Aelan Mosden, Poughkeepsie, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/247,138

(22) Filed: Aug. 25, 2016

(65) Prior Publication Data

US 2017/0069510 A1  Mar. 9, 2017

Related U.S. Application Data

(60) Provisional application No. 62/213,769, filed on Sep. 3, 2015.

(51) Int. Cl.
*H01L 21/311* (2006.01)
*H01L 21/033* (2006.01)
*H01L 21/02* (2006.01)

(52) U.S. Cl.
CPC .. *H01L 21/31144* (2013.01); *H01L 21/02205* (2013.01); *H01L 21/02208* (2013.01); *H01L 21/0332* (2013.01); *H01L 21/0337* (2013.01); *H01L 21/31116* (2013.01)

(58) Field of Classification Search
CPC ............. H01L 21/0332; H01L 21/0335; H01L 21/0331; H01L 21/02186; H01L 21/0228; H01L 21/2208; H01L 21/02205; H01L 21/0337
See application file for complete search history.

(56) References Cited

U.S. PATENT DOCUMENTS

8,334,083 B2 * 12/2012 Luong ................. H01L 21/0337
                                                             430/30
8,389,400 B2   3/2013  Lee et al.
8,450,212 B2   5/2013  Angyal et al.
(Continued)

*Primary Examiner* — Savitr Mulpuri
(74) *Attorney, Agent, or Firm* — Wood Herron & Evans LLP (57) ABSTRACT

Provided is a method for increasing pattern density of a structure on a substrate using an integration scheme, the method comprising: providing a substrate having a first spacer pattern and an underlying layer, the underlying layer comprising a first underlying layer, a second underlying layer, and a target layer; performing a conformal spacer deposition using an oxide, the deposition creating a conformal layer; performing a spacer RIE process and a pull process, thereby generating a second spacer pattern, the spacer RIE process includes adsorption of N-containing gas on a surface of the substrate which activates the surface to react with an F- and/or an H-containing gas to form fluorosilicates; and wherein the integration targets include selectively etching spacer films within a target spacer etch rate, enhanced simultaneous selectivity to the first underlying layer and the second underlying layer and preventing pattern damage.

10 Claims, 9 Drawing Sheets

(56) References Cited

U.S. PATENT DOCUMENTS

| | | | |
|---|---|---|---|
| 8,809,169 B2* | 8/2014 | O'Meara | H01L 21/0337 |
| | | | 438/478 |
| 9,337,020 B2* | 5/2016 | Takachi | H01L 21/0273 |
| 2007/0065990 A1* | 3/2007 | Degroote | H01L 21/0337 |
| | | | 438/142 |
| 2009/0117739 A1 | 5/2009 | Shin et al. | |
| 2009/0311734 A1* | 12/2009 | Greve | G01N 33/54326 |
| | | | 435/29 |
| 2011/0124198 A1 | 5/2011 | Lee et al. | |
| 2015/0001735 A1 | 1/2015 | Mignot et al. | |
| 2016/0300718 A1* | 10/2016 | Raley | H01L 21/0273 |

* cited by examiner

METHOD AND SYSTEM FOR SELECTIVE SPACER ETCH FOR MULTI-PATTERNING SCHEMES

BACKGROUND OF THE INVENTION

Field of the Invention

The invention relates to a method and system of patterning of a film on a substrate and specifically to a method and system for selective spacer etch of structures on a substrate that meet patterning targets.

Description of Related Art

In semiconductor manufacturing patterning of a film on a substrate can be achieved through several methods that have evolved with time to follow Moore's law. Double patterning is the technique used to create hard mask features smaller than photolithographic capabilities by using spacer deposition to define feature dimensions. Typical double patterning (DP) techniques require a sequence of deposition over a mandrel, etch to form the spacer and another etch to remove the mandrel, with both deposition and etch tools required.

Self-aligned double and quadruple patterning and other patterning schemes require a spacer to be formed on the sidewall of a pre-patterned feature. The pre-patterned feature is then removed leaving the spacer as the mask for subsequent patterning. A lot has been done on self-aligned double patterning (SADP) and quadruple patterning (SAQP) for patterning scheme layout but not a lot has been done on focusing and tuning the spacer sidewall mask using reactive ion etch (RIE) for patterning. The spacer sidewall profile has a large impact on subsequent patterning steps in an integration scheme. There is a need for techniques using reactive ion etch to achieve a spacer sidewall mask profile that will help to achieve better profiles in subsequent patterning steps. There is a need for selective spacer etching using various film stacks that completes the etching at a target spacer etch rate, increases simultaneous selectivity to the first and second underlying films while performing spacer etch, and prevents pattern damage.

SUMMARY OF THE INVENTION

Provided is a method for increasing pattern density of a structure on a substrate using an integration scheme, the method comprising: providing a substrate having a first spacer pattern and an underlying layer, the underlying layer comprising a first underlying layer, a second underlying layer, and a target layer; performing a second conformal spacer deposition using an oxide, the deposition creating a second conformal layer; performing a second spacer RIE process and a second pull process, wherein generating a second spacer pattern, the second spacer RIE process includes adsorption of N containing gas on a surface of the substrate which activates the surface to react with an F and/or an H-containing gas to form fluorosilicates; and wherein the integration targets include selectively etching spacer films within a target spacer etch rate, enhanced simultaneous selectivity to the first underlying layer and the second underlying layer and preventing pattern damage.

Also provided is another method for increasing pattern density of a structure on a substrate using an integration scheme, the integration scheme configured to meet integration targets, the method comprising: providing a substrate having a hardened pattern resist layer and an underlying layer; selecting two or more operating variables to control one or more processes of the integration scheme; performing a first positive or first negative patterning process comprising a first conformal spacer deposition process, a first spacer reactive ion etch (RIE) process, and a first pull process on the first conformal layer, the first spacer RIE process and the first pull process creating a first spacer pattern; performing a second positive or second negative patterning process comprising a second conformal spacer deposition, a second spacer reactive ion etch (RIE) process, and a first pull process on the second conformal layer, the second spacer RIE process and the second pull process creating a second spacer pattern; and performing a transfer process of the second spacer pattern into the target layer, the transfer process generating a target pattern; and concurrently controlling the two or more selected operating variables during one or more processes of the group comprising the second conformal spacer deposition process, second spacer RIE process, second pull process, and/or transfer process in order to achieve integration targets using online in situ collected measurements.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings.

DETAILED DESCRIPTION OF SEVERAL EMBODIMENTS

In the following description, for purposes of explanation and not limitation, specific details are set forth, such as a particular geometry of a processing system, descriptions of various components and processes used therein. However, it should be understood that the invention may be practiced in other embodiments that depart from these specific details.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

"Substrate" as used herein generically refers to the object being processed in accordance with the invention. The substrate may include any material portion or structure of a device, particularly a semiconductor or other electronics device, and may, for example, be a base substrate structure, such as a semiconductor wafer or a layer on or overlying a base substrate structure such as a thin film. Thus, substrate is not intended to be limited to any particular base structure, underlying layer or overlying layer, patterned or un-patterned, but rather, is contemplated to include any such layer or base structure, and any combination of layers and/or base structures. The description below may reference particular types of substrates, but this is for illustrative purposes only and not limitation.

The term oxide when used alone shall refer to the oxide in between the pair of structures in the second spacer pattern, which typically is a silicon dioxide or silicon nitride. The term "tilted image" refers to images of substrate structures taken from a non-zero degree angle from a horizontal plane and which includes a combined side view and top view of a structure. The term "non-tilted image" refers to substantially a side view image of substrate structures.

One embodiment of the invention relates to dry, gas phase oxide spacer pull selective to various spacer materials like TiO and trilayer films like SiARC and ODL/APF and facilitates accurate CD transfer to ODL/APF without pattern damage. To achieve the desired critical dimensions in the typical multi-patterning schemes (ex. SAQP, SADP), several steps of spacer deposition and spacer etch are involved. In one embodiment of the present invention, a dry etch technique is used with tunable selectivity to etch $SiO_2$ spacers with respect to several spacer and trilayer films, like TiO, SiN, and SiARC, ODL/APF respectively. This technique facilitates low cost multi-patterning schemes by eliminating multiple spacer deposition-etch steps.

In order to reduce the number of steps in multi-patterning (SAQP type) schemes, one of the most critical aspects is effective critical dimension (CD) transfer into the OPL or APF without line collapse. Three key factors in order to achieve effective CD transfer are: 1) the ability to selectively etch various spacer films, 2) simultaneous selectivity to SiARC and APF while performing spacer etch, and 3) ability to prevent pattern damage. The prior art methods applied for spacer etch steps often lack two or more of the above factors. In the case for oxide spacer etch selective to SiARC, wet chemistry using dilute hydrogen fluoride (DHF) is used. However, DHF-based wet chemistry often lacks the selectivity needed to etch oxide with respect to SiARC and causes pattern collapse.

The present invention is designed to achieve all of the above three factors by using gas phase (Chemical Oxide Removal or COR) chemistry for spacer etch. In addition, gas phase etch enables one to modulate etch selectivity between the films. This gas phase etch is achieved by adsorption of N-containing gas (example: $NH_3$, $NF_3$ etc.) on the surface which activates the surface to react with F-containing and/or H-containing gas (example: HF, $F_2$) to form fluorosilicates as byproduct. The etch/reaction rate of different materials are primarily controlled by two factors: 1) adsorption of the etch gases on the surface and 2) availability or concentration of the etch gases. Furthermore, rate of adsorption for different materials (like TiO, $SiO_2$, SiN, SiARC, ODL, etc.) significantly varies with temperature. Therefore, the ability to fine tune the selectivity between various films is critical. Several modifications of the etch gas mixtures can be applied to achieve this chemistry, for example: $HF/NH_3$, (results shown in FIG. 5B and FIG. 5C), $F_2/N_2/H_2$, $NF_3/NH_3$ etc. Additionally, another embodiment of the present invention involves using a remote plasma generated from said gas mixtures as an alternate tooling configuration or methodology.

Figure 1A:
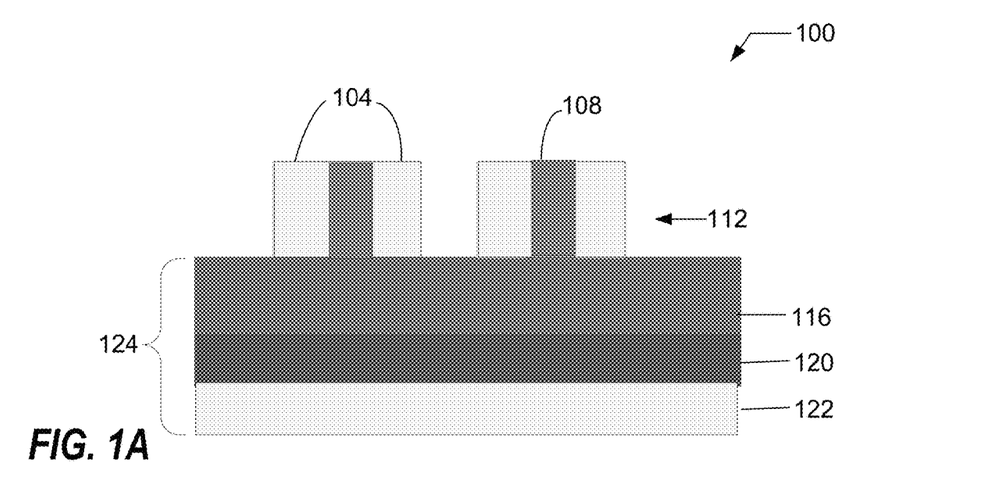
FIG. 1A is an exemplary schematic of an integration scheme showing a first spacer pattern and an underlying layer as a result of previous deposition, RIE, and pull processes.

FIG. 1A is an exemplary schematic 100 of an integration scheme showing a first spacer pattern 112 and an underlying layer 124 as a result of a previous deposition, RIE, and pull processes. The underlying layer 124 comprises a first underlying layer 116, a second underlying layer 120, and a target layer 122. The first underlying layer 116 can be a layer of silicon anti-reflective coating (SiARC), titanium anti-reflective coating (TiARC), optical dispersive layer (ODL), spin on hardmask (SOH), or the like. The second underlying layer 120 can comprise an organic planarizing layer (OPL), advanced planarizing layer (APL), ODL, or SOH. The structures 112 include an oxide 108 in between a pair of spacers 104. The oxide 108 can be silicon dioxide, alone or as a bilayer with silicon nitride. The spacers 104 can comprise titanium oxide, titanium nitride, amorphous silicon, polycrystalline silicon (polysilicon) or the like.

Figure 1B:
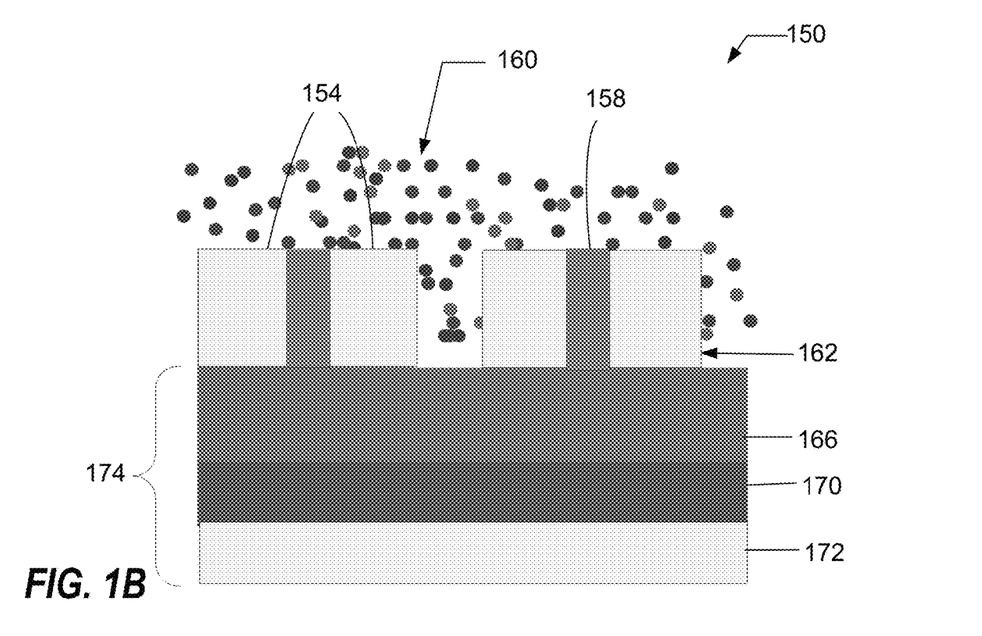
FIG. 1B is an exemplary schematic of the first spacer pattern being exposed to etch gases using the present invention techniques and methods.

FIG. 1B is an exemplary schematic 150 of the first spacer pattern 162 being exposed to etch gases 160 in an embodiment of the present invention. As will be discussed later, the etch gases can include a combination of F-based and N-based gases. Specifically, the etch gases can include $F_2/N_2/H_2$, $NF_3/NH_3$ or anhydrous HF. The process includes a dry etch technique with tunable selectivity to etch $SiO_2$ or SiN spacers with respect to several spacer and trilayer films, like TiO, SiN, and SiARC, and ODL or TiO, SiN, and SiARC, APF, or advanced patterning layer (APL). The present invention facilitates low cost multi-patterning schemes by eliminating multiple spacer deposition-etch steps.

Figure 2:
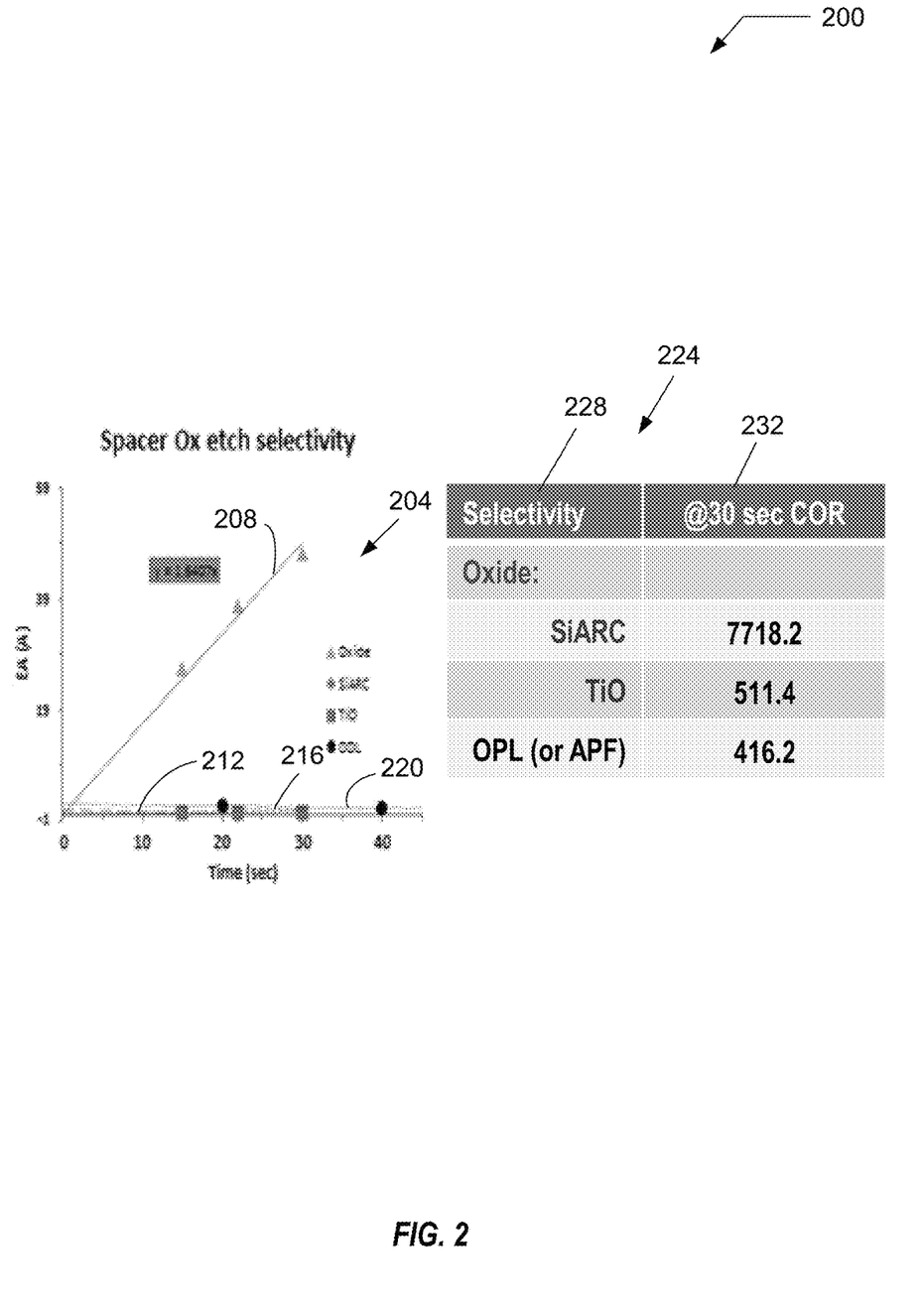
FIG. 2 is graph of spacer chemical oxide removal (COR) selectivity as a function of time where selectivity is compared relative to silicon anti-reflective coating (SiARC), titanium oxide, organic planarizing layer (OPL) or advanced planarizing film (APF).

FIG. 2 is graph 200 of spacer chemical oxide removal (COR) amount as function of time where selectivity of the spacer oxide is compared relative to silicon anti-reflective coating (SiARC), organic planarizing layer (OPL) or advanced planarizing layer (APL). The Y-axis is an etch amount, measured as angstroms etched during a 30-second etch of the COR while the X-axis is time in seconds. The COR graph 208 is a straight line originating from the −1.0 angstroms, zero seconds with a slope close to 1.64 as indicated for the formula of y, etch amount in angstroms as a function of time in seconds. The etch selectivity graphs 204 for SiARC 212, TiO 216, and OPL or APF 220 are shown with etch selectivities 228 and etched amounts 232 in the table 224, 7718.2, 58.4 and 416.2 respectively. As can be observed from the graphs, the etch amount for the oxide is several orders of magnitude times faster than etching of the SiARC, TiO, and OPL or APF.

Figure 3A:
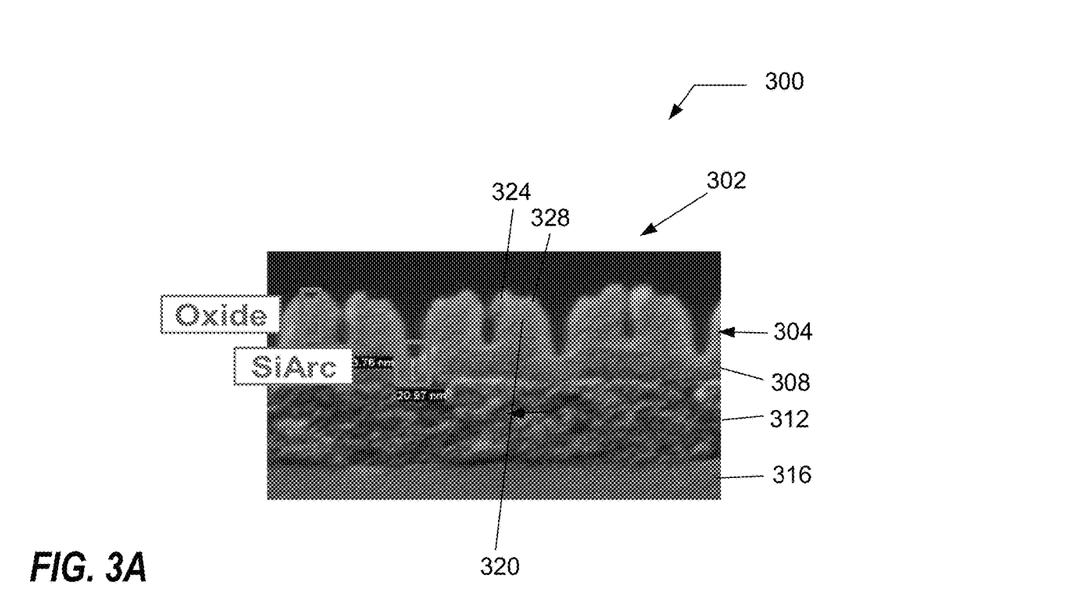
FIG. 3A is an exemplary image of a spacer pattern in a substrate prior to oxide processing.

FIG. 3A is an exemplary image 300 of a spacer pattern 304 in a substrate prior to RIE, in this case, COR processing in an embodiment of the present invention. The spacer pattern 304 has an underlying layer comprising a layer of SiARC 308, OPL or APL 312, and a target layer 316. The structures 302 of the spacer pattern 304 include an oxide 320 in between a pair of spacers 324 and 328. The spacers 324 and 328 can comprise titanium oxide, silicon nitride, or the like.

Figure 3B:
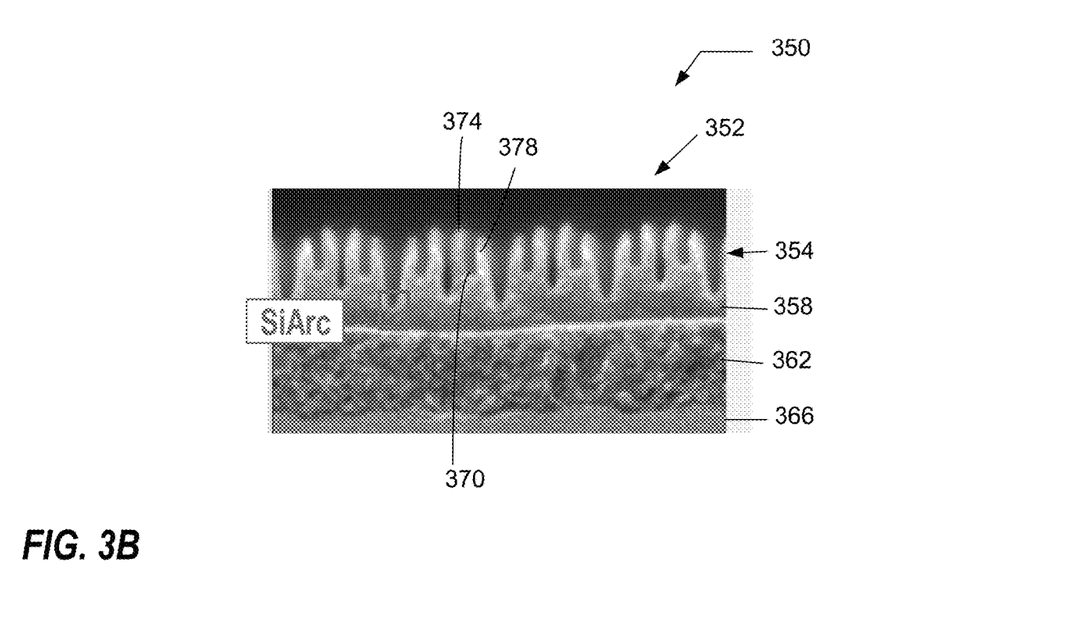
FIG. 3B is an exemplary image of a spacer pattern in a substrate after oxide processing in an embodiment of the present invention.

FIG. 3B is an exemplary image 350 of a spacer pattern 354 in a substrate after COR in an embodiment of the present invention. The spacer pattern 354 and an underlying layer comprising a layer of SiARC 358, organic OPL or APL 362, and a target layer 366. The structures 352 of the spacer pattern 354 include a pair of spacers 374 and 378. It should be noted that the oxide 370 has been etched without gouging the SiARC in between the pairs of spacers, such as 374 and 378.

Figure 4A:
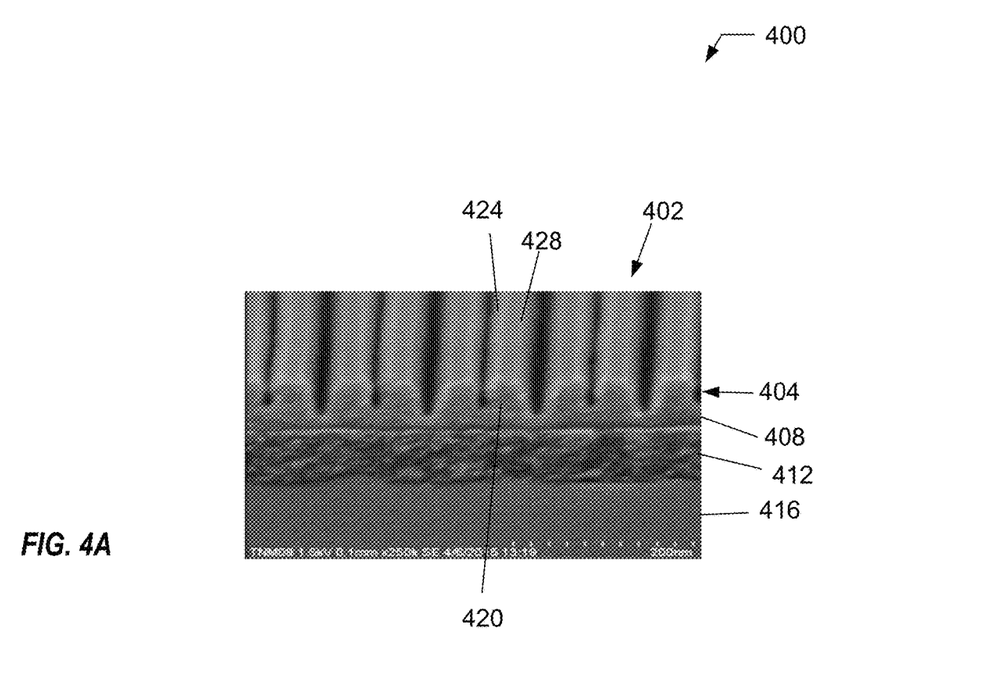
FIG. 4A is an exemplary tilted image of an incoming spacer pattern in a substrate.
Figure 4B:
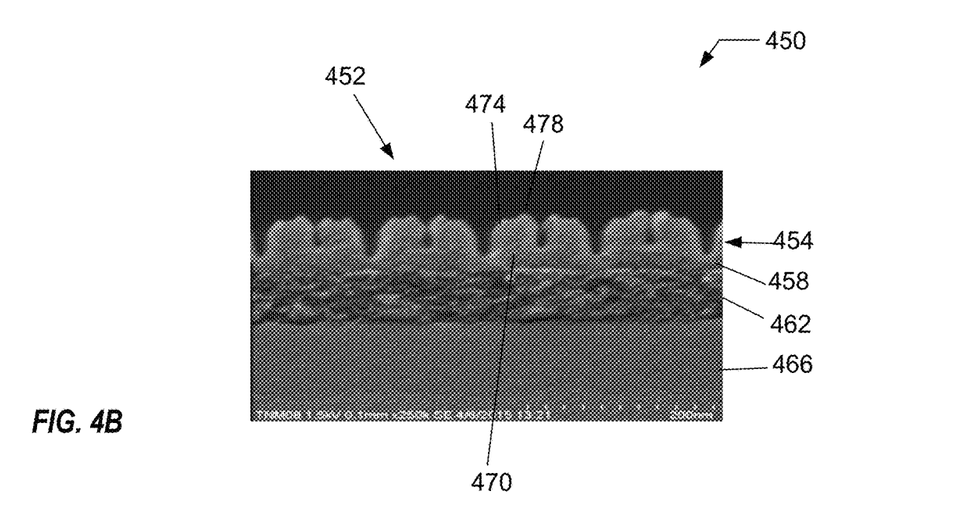
FIG. 4B is an exemplary non-tilted image of a spacer pattern in a substrate.

FIG. 4A is an exemplary tilted image 400 of a spacer pattern 404 in an incoming substrate. The spacer pattern 404 has an underlying layer comprising a layer of SiARC 408, OPL or APL 412, and a target layer 416. The structures 402 of the spacer pattern 404 include an oxide 420 in between a pair of spacers 424 and 428. FIG. 4B is an exemplary non-tilted image 450 of a spacer pattern 454 in an incoming substrate. The spacer pattern 454 has an underlying layer comprising a layer of SiARC 458, organic OPL or APL 462, and a target layer 466. The structures 452 of the spacer pattern 454 include an oxide 470 in between a pair of spacers 474 and 478. The pair of spacers 474 and 478 appears to have a right angle trapezoidal shape.

Figure 5A:
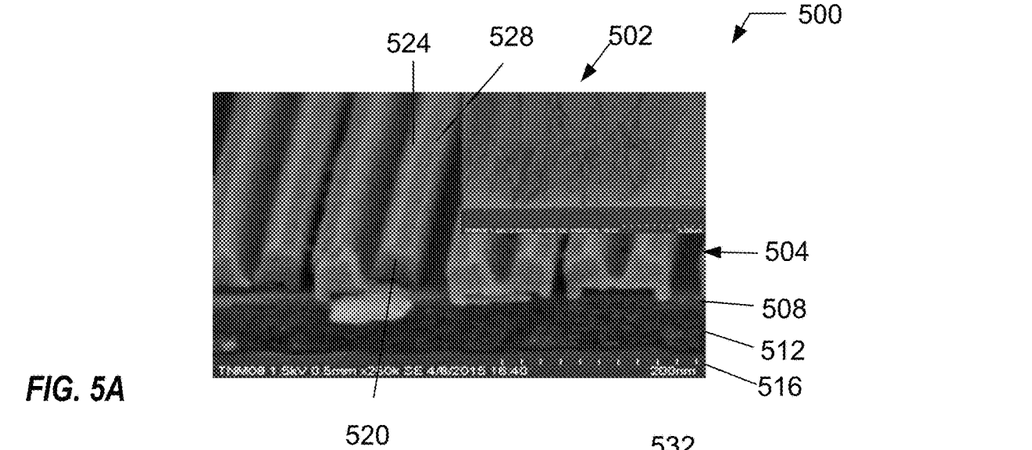
FIG. 5A is an exemplary tilted image of a spacer pattern in a substrate that highlights the results of etching the spacer pattern with dilute hydrogen fluoride at 1:200 ratio of the chemical to air for 15 seconds.

FIG. 5A is an exemplary tilted image 500 of a spacer pattern 504 in a substrate that highlights the results of etching the spacer pattern 504 with dilute, (i.e., wet), hydrogen fluoride at 1:200 ratio of the hydrogen fluoride to water. The test was conducted for 15 seconds. The spacer pattern 504 has an underlying layer comprising a layer of SiARC 508, an OPL or APL 512, and a target layer 516. The structures 502 of the spacer pattern 524 include an oxide 520 in between a pair of spacers 524 and 528. Note that the oxide 520 was not etched. In other words, the spacer etch failed when the wet etch process was utilized.

Figure 5B:
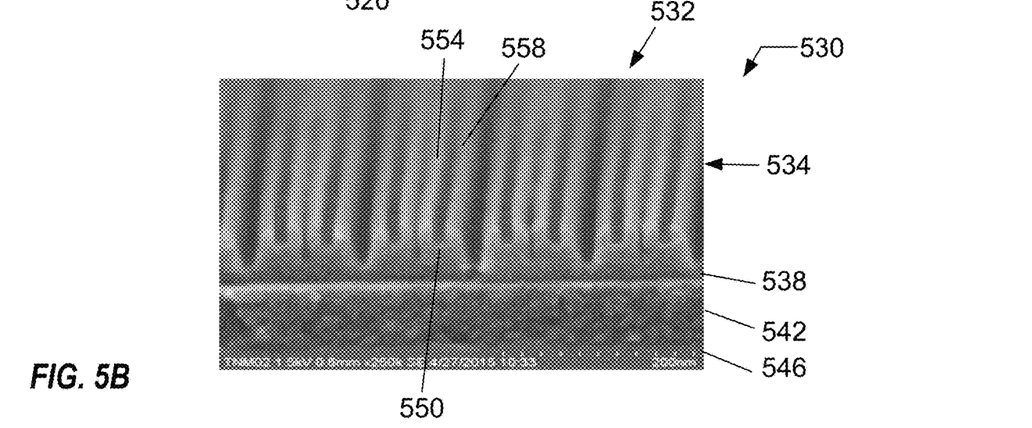
FIG. 5B is an exemplary tilted image of the spacer pattern in a substrate that highlights the results of the second spacer RIE process in an embodiment of the present invention.

FIG. 5B is an exemplary tilted image 530 of the spacer pattern 534 in a substrate that highlights the results of the second spacer RIE process in an embodiment of the present invention. The spacer pattern 534 has an underlying layer comprising a layer of SiARC 538, organic OPL or APL 542, and a target layer 546. The structures 532 of the spacer pattern 534, includes an oxide 550 in between a pair of spacers 554 and 558. The image 530 shows that the oxide 550 has been etched by the gas mixture without damaging the organic OPL or APL 542 or the target layer 546.

Figure 5C:
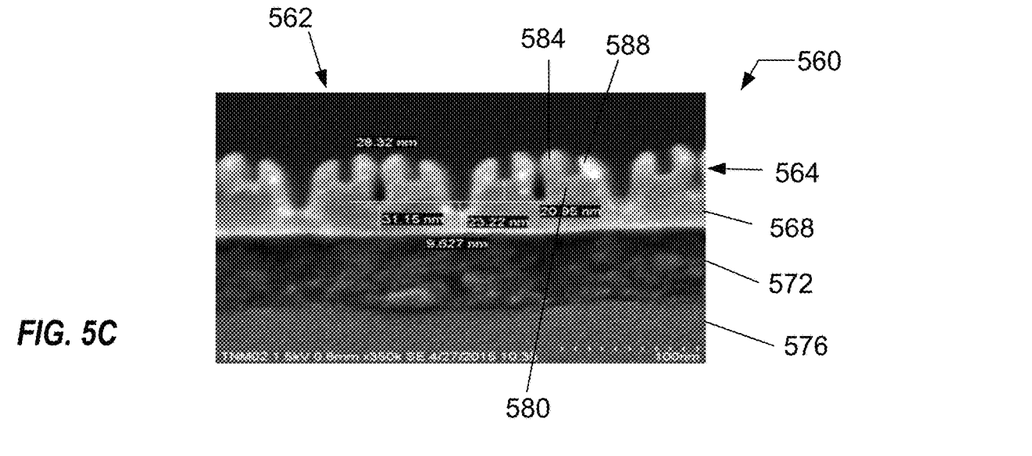
FIG. 5C is an exemplary non-tilted image of the spacer pattern in a substrate that highlights the results the second spacer pull process in an embodiment of the present invention.

FIG. 5C is an exemplary non-tilted image 560 of the spacer pattern 564 in a substrate that highlights the results the second spacer pull process in an embodiment of the present invention. The structures 562 of the spacer pattern 564, has an underlying layer comprising a layer of SiARC 568, organic OPL or APL 572, and a target layer 576. The spacer pattern 564 shows the oxide 580 in between a pair of spacers 584 and 588. The inventors found that in contrast to the wet etch process that did not remove the oxide and caused roughness metric issues including potential collapse of the spacer pattern 504 in FIG. 5A, the dry etch oxide removal process and the second spacer pull process used to get the results shown in FIG. 5C, has etched the spacer pattern 564 to the proper height and all the other dimensional parameters are within the acceptable ranges established for the application.

Figure 6:
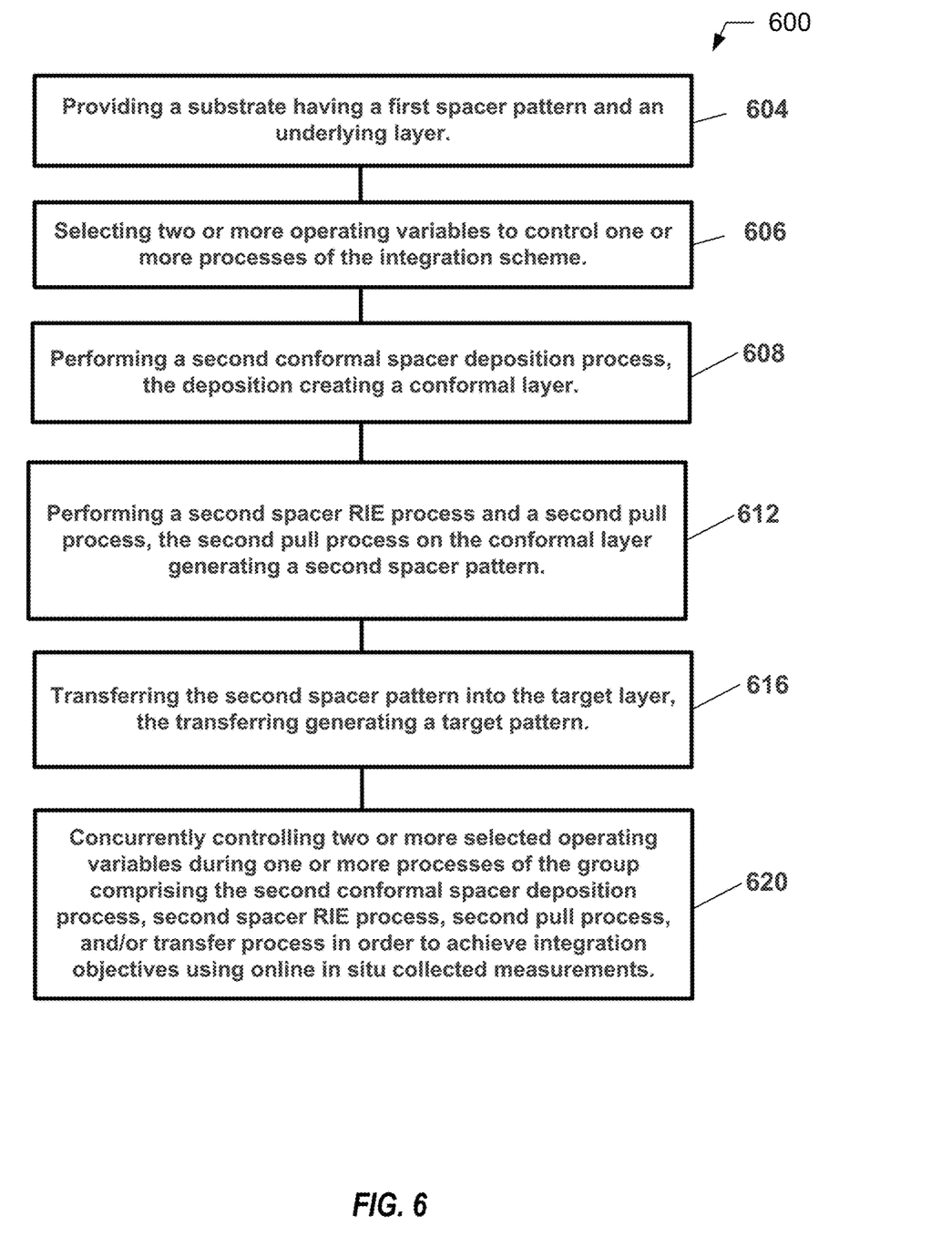
FIG. 6 is an exemplary process flow chart of the method of performing oxide processing in an embodiment of the present invention.

FIG. 6 is an exemplary process flow chart 600 of the method of performing oxide processing in an embodiment of the present invention. In operation 604, a substrate having a first spacer pattern and an underlying layer is provided. The first spacer pattern can comprise titanium dioxide, titanium nitride, amorphous silicon, polycrystalline silicon or polysilicon, or the like. The oxide can be silicon dioxide, silicon nitride, or the like. The underlying layer can include a first underlying layer, a second underlying layer, and a target layer. The first underlying layer can comprise SiARC, TiARC, optical dispersive layer (ODL), spin on hardmask (SOH), or the like. The second underlying layer can comprise ODL, SOH, APL, or the like. The first spacer pattern can be fabricated using a deposition/RIE/pull sequence or some other equivalent fabrication process. In operation 606, two or more operating variables are selected to control one or more processes of the integration scheme. Examples of operating variables include chamber temperature, chamber pressure, flow rates of the etch gases, process time, and the like.

In operation 608, a second conformal spacer deposition process is performed, the deposition creating a conformal layer. The conformal layer can comprise titanium dioxide, titanium nitride, amorphous silicon, polycrystalline silicon or polysilicon, or the like. In operation 612, a second spacer RIE process and a second pull process is performed, the second pull process on the conformal layer generating a second spacer pattern. The second spacer can be a silicon dioxide or a $Si_xN_y$ compound.

The second spacer RIE process can include an etch using etch gases comprising a combination of F-based and N-based gases, collectively called etch gases. Furthermore, the etch gases can comprise $F_2/N_2/H_2$ or $NF_3/NH_3$ or anhydrous HF. Performing the second spacer RIE process includes adsorption of N-containing gas on a surface of the substrate which activates the surface to react with an F and/or an H-containing gas to form fluorosilicates and where an etch rate of the second spacer RIE process is controlled by the adsorption of etch gases and concentration of the etch gases. The adsorption rate varies by type of material in the substrate and temperature of the process chamber. The temperature in the process chamber can be in a range from 20 to 35 degrees C. and the pressure can be in a range from 20 to 2,000 mTorr. Anhydrous HF can have a flow rate in a range of 10 to 160 sccm, other gases used such as $NH_3$ can have a flow rate in a range of 10 to 160 sccm, $N_2$ in a range of 0 to 2,000 sccm, and Ar in a range of 0 to 299 sccm. Length of processing of the RIE process can be in a range of 10 to 80 seconds.

Performance of the second spacer RIE process and second pull process can be stopped if gas flows of the etch gases and/or the temperature of the process chamber are outside of established ranges. Moreover, a controller is utilized to control selected operating variables in order to ensure integration targets are achieved. The second spacer RIE process and the second pull process can be performed with remote generated plasma, for example, plasma generated outside of the processing chamber.

In test performed by the inventors, the second spacer RIE process and second pull process were performed without gouging the SiARC. The second spacer RIE process and second pull process were performed without damage to the titanium oxide. The integration targets include selectively etching various spacer films within a target spacer etch rate, enhanced simultaneous selectivity to SiARC and the OPL while performing spacer etch, and/or preventing pattern damage.

In operation 616, the second spacer pattern is transferred into the target layer, the transferring generating a target pattern. In operation 620, two or more selected operating variables are concurrently controlled during one or more processes of the group comprising the second conformal spacer deposition process, second spacer RIE process, second pull process, and/or transfer process in order to achieve integration targets using online in situ collected measurements. The inventors found that selective spacer etch using gas phase (dry) chemistry enables multi-pattern schemes without the need of multiple spacer deposition-etch steps, with accurate CD transfer to the targeted layer and minimal pattern damage. With the above mentioned technique of controlling selected operating variables, the etch selectivity within various films enabled the inventors to achieve process performance not possible with wet etch approaches.

Figure 7:
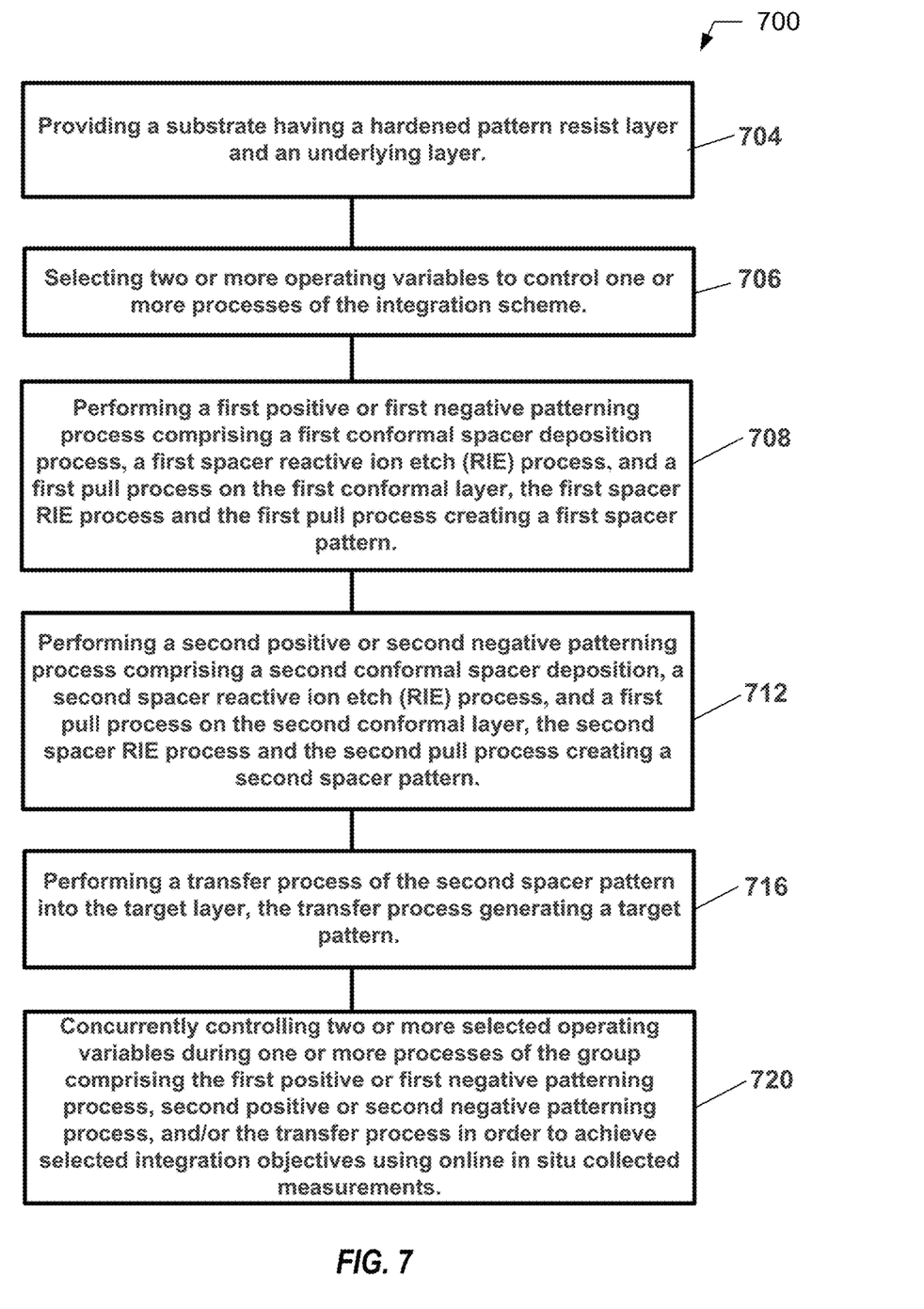
FIG. 7 is an exemplary process flow chart of the method of performing oxide processing using positive or negative patterning processes in another embodiment of the present invention.

FIG. 7 is an exemplary process flow chart 700 of the method of performing oxide processing in another embodiment of the present invention. In operation 704, a substrate having a hardened pattern resist layer and an underlying layer is provided. In operation 706, two or more operating variables are selected to control one or more processes of the integration scheme. Examples of operating variables include chamber temperature, chamber pressure, flow rates of the etch gases, process time, and the like.

The concepts of positive and negative patterning technology will be covered in the next paragraphs. The spacer patterning technology may largely be divided into a positive spacer patterning technology and a negative spacer patterning technology. The positive spacer patterning technology includes using spacers as a direct mask in a pattern formation process. The negative spacer patterning technology includes using space between spacers.

For instance, the positive spacer patterning technology includes forming an etch stop layer and a sacrificial layer over an etch-target layer. A photoresist pattern is formed over the sacrificial layer, the photoresist pattern having a pitch greater than a photo-exposure pitch limit. The sacrificial layer is etched using the photoresist pattern to form a sacrificial pattern. Spacers are formed on both sides of the sacrificial pattern.

The sacrificial pattern is then removed. The etch stop layer and the etch-target layer are etched using the remaining spacers. Thus, an etch-target pattern having a value of a photo-exposure pitch limit or less may be formed.

Meanwhile, the negative spacer patterning technology includes forming an etch stop layer and a sacrificial layer over an etch-target layer. A photoresist pattern is formed over the sacrificial layer, the photoresist pattern having a value of a photo-exposure pitch limit or greater. The sacrificial layer is etched using the photoresist pattern to form a sacrificial pattern. Spacers are formed on both sides of the sacrificial pattern.

A capping layer is formed over the resultant structure including the sacrificial pattern and the spacers. A planarization process is performed on the structure until the spacers are exposed. Thus, a capping pattern filled between the spacers is formed. The spacers are then removed. The etch stop layer and the etch-target layer are etched using the remaining sacrificial pattern and the capping pattern. Thus, an etch-target pattern having a value of a photo-exposure pitch limit or less may be formed.

The positive spacer patterning technology or the negative spacer patterning technology is selectively used when forming a pattern in a semiconductor device. Use of either positive spacer patterning technology or the negative spacer patterning technology or both is compatible with the principles and features of the present invention.

In operation 708, a first positive or first negative spacer patterning process is performed, the first positive or first negative patterning process comprising a first conformal spacer deposition process, a first spacer reactive ion etch (RIE) process, and a first pull process on the first conformal layer, the first spacer RIE process and the first pull process creating a first spacer pattern.

In operation 712, a second positive or second negative spacer patterning process is performed, the second positive or second negative patterning process comprising a second conformal spacer deposition, a second spacer reactive ion etch (RIE) process, and a first pull process on the second conformal layer, the second spacer RIE process and the second pull process creating a second spacer pattern.

In operation 716, a transfer process of the second spacer pattern into the target layer is performed, the transfer process generating a target pattern. In operation 720, two or more selected operating variables are concurrently controlled during one or more processes of the group comprising the first positive or first negative spacer patterning process, second positive or second negative spacer patterning process, and/or the transfer process in order to achieve selected integration targets using online in situ collected measurements. The measurements are used to adjust the selected two or more selected operating variables during the one or more processes used to perform the selective spacer etch for multi-patterning schemes. With regards to positive or negative patterning process, in an embodiment, the first spacer pattern is created using a positive patterning process and the second spacer pattern is created using a positive patterning process. In another embodiment, the first spacer pattern is created using a positive patterning process and the second spacer pattern is created using a negative patterning process. In still another embodiment, the first spacer pattern is created using a negative patterning process and the second spacer pattern is created using a positive patterning process. In yet another embodiment, the first spacer pattern is created using a negative patterning process and the second spacer pattern is created using a negative patterning process.

Figure 8:
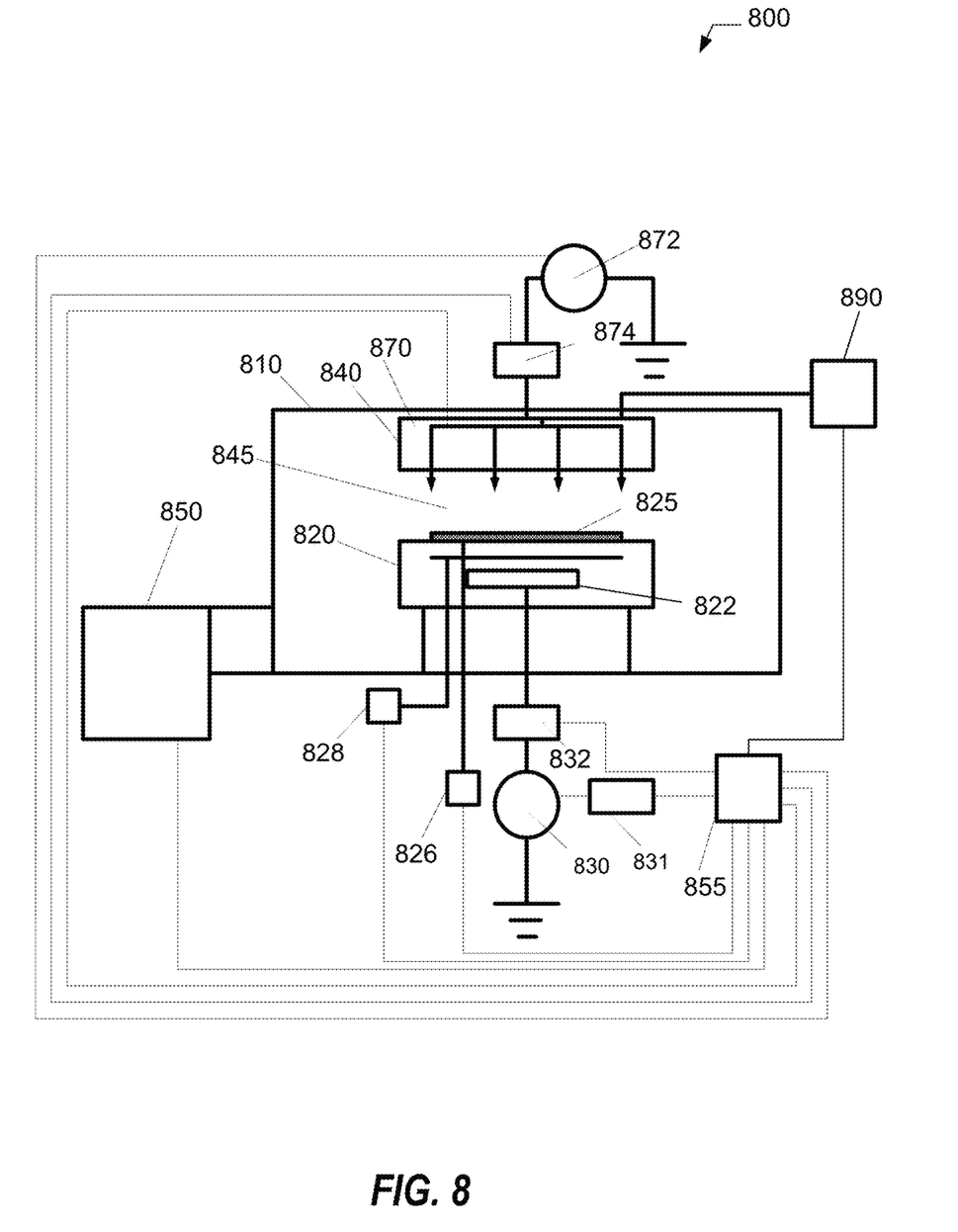
FIG. 8 depicts an exemplary processing system to perform the fabrication processes for selective spacer etch for multi-patterning schemes in an embodiment of the present invention.

FIG. 8 depicts an exemplary processing system to perform the fabrication processes for selective spacers etch for multi-patterning schemes in an embodiment of the present invention. A plasma etching system 800 configured to perform the above identified process conditions is depicted in FIG. 8 comprising a plasma processing chamber 810, substrate holder 820, upon which a substrate 825 to be processed is affixed, and vacuum pumping system 850. Substrate 825 can be a semiconductor substrate, a wafer, a flat panel display, or a liquid crystal display. Plasma processing chamber 810 can be configured to facilitate the generation of plasma in plasma processing region 845 in the vicinity of a surface of substrate 825. An ionizable gas or mixture of process gases is introduced via a gas distribution system 840. For a given flow of process gas, the process pressure is adjusted using the vacuum pumping system 850. Plasma can be utilized to create materials specific to a pre-determined materials process, and/or to aid the removal of material from the exposed surfaces of substrate 825. The plasma processing system 800 can be configured to process substrates of any desired size, such as 200 mm substrates, 300 mm substrates, or larger.

Substrate 825 can be affixed to the substrate holder 820 via a clamping system 828, such as a mechanical clamping system or an electrical clamping system (e.g., an electrostatic clamping system). Furthermore, substrate holder 820 can include a heating system (not shown) or a cooling system (not shown) that is configured to adjust and/or control the temperature of substrate holder 820 and substrate 825. The heating system or cooling system may comprise a re-circulating flow of heat transfer fluid that receives heat from substrate holder 820 and transfers heat to a heat exchanger system (not shown) when cooling, or transfers heat from the heat exchanger system to substrate holder 820 when heating. In other embodiments, heating/cooling elements, such as resistive heating elements, or thermo-electric heaters/coolers can be included in the substrate holder 820, as well as the chamber wall of the plasma processing chamber 810 and any other component within the plasma processing system 800.

Additionally, a heat transfer gas can be delivered to the backside of substrate 825 via a backside gas supply system 826 in order to improve the gas-gap thermal conductance between substrate 825 and substrate holder 820. Such a system can be utilized when temperature control of the substrate is required at elevated or reduced temperatures. For example, the backside gas supply system can comprise a two-zone gas distribution system, wherein the helium gas-gap pressure can be independently varied between the center and the edge of substrate 825.

In the embodiment shown in FIG. 8, substrate holder 820 can comprise an electrode 822 through which RF power is coupled to the processing plasma in plasma processing region 845. For example, substrate holder 820 can be electrically biased at a RF voltage via the transmission of RF power from a RF generator 830 through an optional impedance match network 832 to substrate holder 820. The RF electrical bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from about 0.1 MHz to about 80 MHz. RF systems for plasma processing are well known to those skilled in the art.

Furthermore, the electrical bias of electrode 822 at a RF voltage may be pulsed using pulsed bias signal controller 831. The RF power output from the RF generator 830 may be pulsed between an off-state and an on-state, for example. Alternately, RF power is applied to the substrate holder electrode at multiple frequencies. Furthermore, impedance match network 832 can improve the transfer of RF power to plasma in plasma processing chamber 810 by reducing the reflected power. Match network topologies (e.g. L-type, π-type, T-type, etc.) and automatic control methods are well known to those skilled in the art.

Gas distribution system 840 may comprise a showerhead design for introducing a mixture of process gases. Alternatively, gas distribution system 840 may comprise a multi-zone showerhead design for introducing a mixture of process gases and adjusting the distribution of the mixture of process gases above substrate 825. For example, the multi-zone showerhead design may be configured to adjust the process gas flow or composition to a substantially peripheral region above substrate 825 relative to the amount of process gas flow or composition to a substantially central region above substrate 825.

Vacuum pumping system 850 can include a turbo-molecular vacuum pump (TMP) capable of a pumping speed up to about 8000 liters per second (and greater) and a gate valve for throttling the chamber pressure. In conventional plasma processing devices utilized for dry plasma etching, an 800 to 3000 liter per second TMP can be employed. TMPs are useful for low pressure processing, typically less than about 50 mTorr. For high pressure processing (i.e., greater than about 80 mTorr), a mechanical booster pump and dry roughing pump can be used. Furthermore, a device for monitoring chamber pressure (not shown) can be coupled to the plasma processing chamber 810.

As mentioned above, the controller 855 can comprise a microprocessor, memory, and a digital I/O port capable of generating control voltages sufficient to communicate and activate inputs to plasma processing system 800 as well as monitor outputs from plasma processing system 800. Moreover, controller 855 can be coupled to and can exchange information with RF generator 830, pulsed bias signal controller 831, impedance match network 832, the gas distribution system 840, vacuum pumping system 850, as well as the substrate heating/cooling system (not shown), the backside gas supply system 826, power coupling system 890, and/or the electrostatic clamping system 828. For example, a program stored in the memory can be utilized to activate the inputs to the aforementioned components of plasma processing system 800 according to a process recipe in order to perform a plasma assisted process, such as a plasma etch process, on substrate 825.

In addition, the plasma processing system 800 can further comprise an upper electrode 870 to which RF power can be coupled from RF generator 872 through optional impedance match network 874. A frequency for the application of RF power to the upper electrode can range from about 0.1 MHz to about 200 MHz. Additionally, a frequency for the application of power to the lower electrode can range from about 0.1 MHz to about 80 MHz. Moreover, controller 855 is coupled to RF generator 872 and impedance match network 874 in order to control the application of RF power to upper electrode 870. The design and implementation of an upper electrode is well known to those skilled in the art. The upper electrode 870 and the gas distribution system 840 can be designed within the same chamber assembly, as shown. Alternatively, upper electrode 870 may comprise a multi-zone electrode design for adjusting the RF power distribution coupled to plasma above substrate 825. For example, the upper electrode 870 may be segmented into a center electrode and an edge electrode.

Depending on the applications, additional devices such as sensors or metrology devices can be coupled to the plasma processing chamber 810 and to the controller 855 to collect real time data and use such real time data to concurrently control two or more selected integration operating variables in two or more steps involving deposition processes, RIE processes, pull processes, profile reformation processes, and/or pattern transfer processes of the integration scheme. Furthermore, the same data can be used to ensure integration targets including patterning uniformity (uniformity), pulldown of structures (pulldown), slimming of structures (slimming), aspect ratio of structures (aspect ratio), line width roughness, line edge roughness, and the like are achieved.

Figure 9:
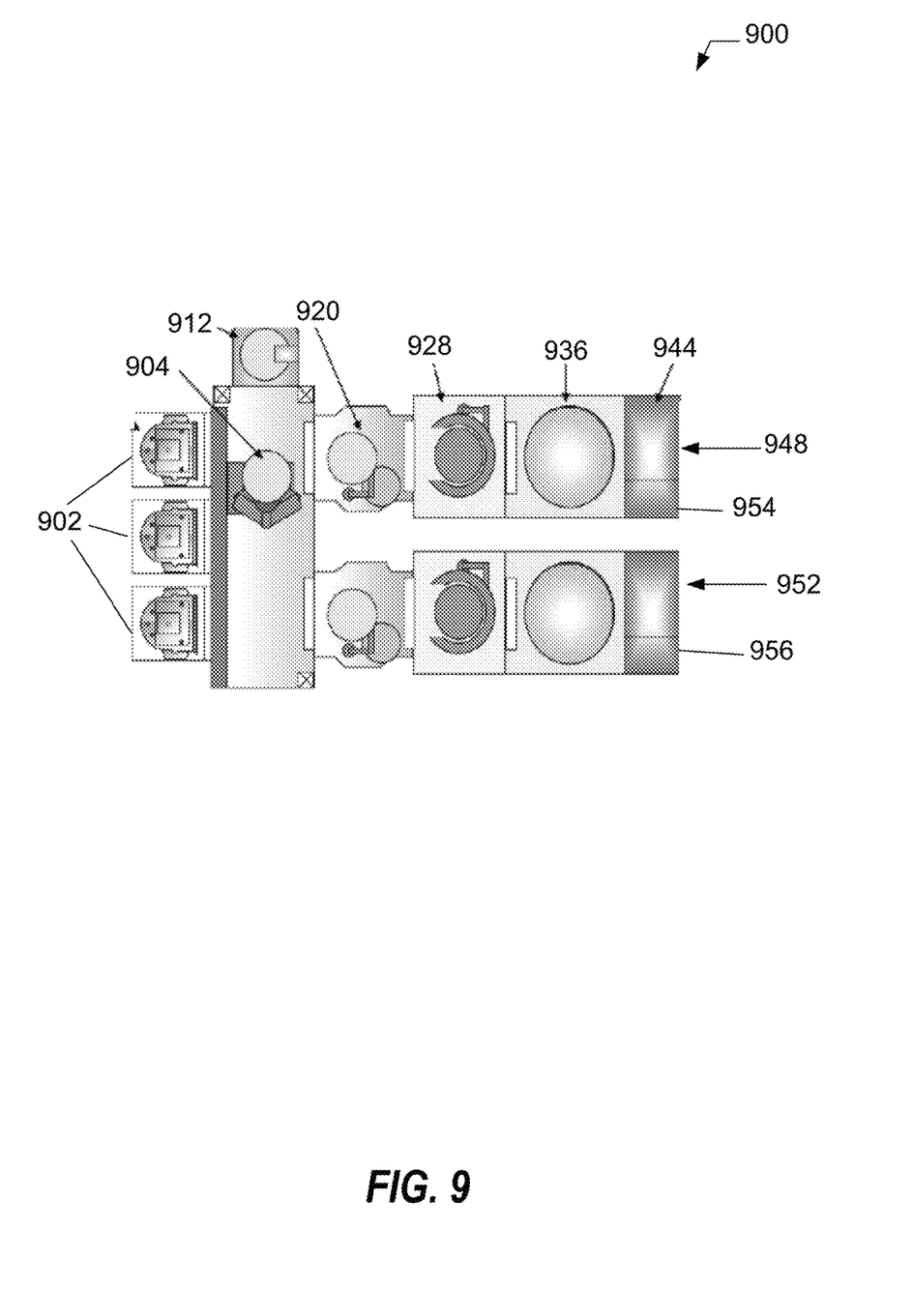
FIG. 9 is an exemplary schematic of a semiconductor apparatus capable of performing the processing enumerated in the list of processes in the exemplary process flow charts of the embodiments of the present invention.

FIG. 9 is an exemplary schematic 900 of a semiconductor apparatus capable of performing the processes discussed in the exemplary process flow charts, FIG. 6 and FIG. 7, of embodiments of the present invention. The semiconductor apparatus includes oxide removal equipment 936, post heat treatment equipment 928, load lock module 920, an orienteer 912, a loader module 904, gas box and controller 944, and load ports 902. Typically, one set of equipment like oxide removal equipment 936, post heat treatment equipment 928, load lock module 920 are configured as a first module 948 and another set of similar equipment are configured as a second module 952. The first module 948 and the second module 952 share use of the load ports 902 and the loader module 904. In some systems, control consoles, 954 and 956, are included in the setup where the control consoles, 954 and 956, are used to enter data needed to control the processes for selective spacer etch for multi-patterning schemes.

Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

We claim:

1. A method for increasing pattern density of a structure on a substrate using an integration scheme, the integration scheme configured to meet integration targets, the method comprising:
    providing a substrate in a process chamber, the substrate having a first spacer pattern and an underlying layer, the underlying layer comprising a first underlying layer, a second underlying layer, and a target layer, wherein the first underlying layer is one of a layer of silicon anti-reflective coating (SiARC), titanium anti-reflective coating (TiARC), optical dispersive layer (ODL), or spin on hardmask (SOH), and wherein the second underlying layer is one of an organic planarizing layer (OPL), advanced planarizing layer (APL), ODL, or SOH;
    selecting two or more operating variables to control one or more processes of the integration scheme;
    performing a conformal spacer deposition using an oxide, the deposition creating a conformal layer;
    performing a spacer RIE process and a pull process, the pull process on the conformal layer, thereby generating a second spacer pattern, wherein the spacer RIE process includes adsorption and reaction of etch gases to form fluorosilicates, wherein the etch gases comprise a combination of F-based and N-based gases;
    transferring the second spacer pattern into the target layer, the transferring generating a target pattern; and
    concurrently controlling the two or more selected operating variables of one or more processes of the group including performing the conformal spacer deposition process using titanium oxide or silicon oxide, the deposition creating the conformal layer; performing the spacer RIE process and the pull process; and/or transferring the second spacer pattern into the target layer; wherein the integration targets include selectively etching various spacer films within a target spacer etch rate, enhanced simultaneous selectivity for the oxide relative to the first underlying layer and the second underlying layer while performing spacer etch, and/or preventing pattern damage to the second spacer pattern.

2. The method of claim 1 wherein the spacer RIE process and pull process are performed without damage to the first underlying layer and the second underlying layer.

3. The method of claim 2 wherein pressure in the process chamber is in a range from 20 to 2,000 mTorr.

4. The method of claim 3 wherein temperature in the process chamber is in a range from 20 to 35 degrees C.

5. The method of claim 1 wherein the etch gases comprise $F_2/N_2/H_2$, $NF_3/NH_3$, or anhydrous HF.

6. The method of claim 2 wherein other gases used include $NH_3$ in a range of 10 to 160 sccm, $N_2$ in a range of 0 to 2,000 sccm, Ar in a range of 0 to 299 sccm, or anhydrous HF in a range of 10 to 160 sccm.

7. The method of claim 6 wherein the adsorption rate varies by type of material in the substrate and temperature of the process chamber.

8. The method of claim 7 wherein performance of the spacer RIE process and pull process are stopped if gas flows of the etch gases and/or the temperature of the process chamber are outside of established ranges.

9. The method of claim 1 wherein a controller is utilized to control the two or more selected operating variables in order to ensure integration targets are achieved.

10. The method of claim 1 wherein the spacer RIE process and the pull process are performed with remote generated plasma.

* * * * *